(12) United States Patent
Ishizaki (10) Patent No.: US 7,005,585 B2
(45) Date of Patent: Feb. 28, 2006

(54) MOUNTING BOARD AND ELECTRONIC DEVICE USING SAME

(75) Inventor: Hiroyuki Ishizaki, Yasu-gun (JP)

(73) Assignee: Murata Manufacturing Co., Ltd., (JP)

( * ) Notice: Subject to any disclaimer, the term of this patent is extended or adjusted under 35 U.S.C. 154(b) by 0 days.

(21) Appl. No.: 11/077,930

(22) Filed: Mar. 11, 2005

(65) Prior Publication Data

US 2005/0155790 A1  Jul. 21, 2005

Related U.S. Application Data

(62) Division of application No. 10/644,487, filed on Aug. 20, 2003.

(30) Foreign Application Priority Data

Sep. 2, 2002  (JP) .............................. 2002-256288

(51) Int. Cl.
*H05K 1/16* (2006.01)
(52) U.S. Cl. ...................... 174/260; 174/261; 361/777; 257/778
(58) Field of Classification Search ................ 174/261, 174/260, 255, 267, 250; 361/760, 762, 767, 361/777, 783; 257/778, 737, 738
See application file for complete search history.

(56) References Cited

U.S. PATENT DOCUMENTS

| | | | | |
|---|---|---|---|---|
| 4,859,808 A | * | 8/1989 | Jeter et al. ................... | 174/261 |
| 5,218,234 A | * | 6/1993 | Thompson et al. .......... | 257/787 |
| 5,378,859 A | * | 1/1995 | Shirasaki et al. ............ | 174/261 |
| 5,397,864 A | * | 3/1995 | Rai et al. .................... | 174/261 |
| 5,650,595 A | * | 7/1997 | Bentlage et al. ............. | 174/260 |
| 6,049,122 A | * | 4/2000 | Yoneda ....................... | 257/668 |

FOREIGN PATENT DOCUMENTS

| | | |
|---|---|---|
| JP | 04-082241 | 3/1992 |
| JP | 08-153752 | 6/1996 |
| JP | 8-330358 | 12/1996 |
| JP | 9-260435 | 10/1997 |
| JP | 2000-031203 | 1/2000 |
| JP | 2000-357763 | 12/2000 |

OTHER PUBLICATIONS

Austrian Patent Office Search Report and Examination Report.
Japanese Examination Report (Aug. 30, 2005) with English language translation.

* cited by examiner

Primary Examiner—Kamand Cuneo
Assistant Examiner—Ishwar (I. B.) Patel
(74) Attorney, Agent, or Firm—Ostrolenk, Faber, Gerb & Soffen, LLP (57) ABSTRACT

Wiring electrodes are formed on a first principal surface of a base substrate. An insulation film partially covers the first principal surface of the base substrate and the wiring electrodes. The insulation film has opening portions where the base substrate and the wiring electrodes are not coated with the insulation film. An electronic component having bump electrodes is mounted on the mounting board by connecting the bump electrodes with the wiring electrodes in the opening portions. A gap between the first principal surface of the base substrate and the electronic component is filled with sealing resin. The opening portions are substantially orthogonal to the longitudinal direction of the wiring electrodes. The ratio of the minimum width of a portion of the base substrate exposed at each of the opening portions to the thickness of the insulation film may advantageously be greater than or equal to 2.

8 Claims, 9 Drawing Sheets

STATE OF OCCURRENCE OF VOIDS (VISCOSITY: 0.4 Pa•s)

| LONGITUDINAL LENGTH (L1) | INSULATOR THICKNESS (T) | | OCCURRENCE OF VOIDS |
|---|---|---|---|
| (L1) | (T) | L1/T | |
| 30 μm | 30 μm | 1.00 | VOIDS OCCURRED |
| 50 μm | 30 μm | 1.67 | VOIDS OCCURRED |
| 60 μm | 30 μm | 2.00 | NO VOID |
| 70 μm | 30 μm | 2.33 | NO VOID |
| 90 μm | 30 μm | 3.00 | NO VOID |
| 30 μm | 50 μm | 0.60 | VOIDS OCCURRED |
| 50 μm | 50 μm | 1.00 | VOIDS OCCURRED |
| 70 μm | 50 μm | 1.40 | VOIDS OCCURRED |
| 90 μm | 50 μm | 1.80 | VOIDS OCCURRED |
| 100 μm | 50 μm | 2.00 | NO VOID |
| 120 μm | 50 μm | 2.40 | NO VOID |
| 150 μm | 50 μm | 3.00 | NO VOID |

STATE OF OCCURRENCE OF VOIDS (VISCOSITY: 7.3 Pa•s)

FIG. 3B

| LONGITUDINAL LENGTH (L1) | INSULATOR THICKNESS (T) | | OCCURRENCE OF VOIDS |
|---|---|---|---|
| (L1) | (T) | L1/T | |
| 30 μm | 30 μm | 1.00 | VOIDS OCCURRED |
| 50 μm | 30 μm | 1.67 | VOIDS OCCURRED |
| 60 μm | 30 μm | 2.00 | NO VOID |
| 70 μm | 30 μm | 2.33 | NO VOID |
| 90 μm | 30 μm | 3.00 | NO VOID |

FIG. 9   PRIOR ART

MOUNTING BOARD AND ELECTRONIC DEVICE USING SAME

CROSS-REFERENCE TO RELATED APPLICATIONS

This is a Divisional of U.S. patent application Ser. No. 10/644,487, filed Aug. 20, 2003 in the name of Hiroyuki ISHIZAKI, entitled MOUNTING BOARD AND ELECTRONIC DEVICE USING THE SAME, incorporated by reference.

BACKGROUND OF THE INVENTION

1. Field of the Invention

The present invention relates to a mounting board on which an electronic component can be flip-chip mounted using bump electrodes, and to an electronic device using the mounting board.

2. Description of the Related Art

In known electronic devices, an electronic component, such as a semiconductor element, is flip-chip mounted on a circuit board using bump electrodes. Such electronic devices are formed by mounting the electronic component having bumps face-down on connection electrodes formed on the circuit board, filling a gap between the circuit board and the electronic component with sealing resin, and heat-hardening the sealing resin in an oven. The sealing resin between the circuit board and the electronic component contributes to mitigation of thermal stress applied to the bumps due to the difference in thermal expansion coefficient between the electronic component and the circuit board.

In such electronic devices, for example when solder bumps are used as the bump electrodes, an insulation film is formed over wiring electrodes to prevent the solder from spreading (wetting) more than necessary. The insulation film is also useful, for example, for covering an appropriate portion of metal plating, such as Au, or in order to prevent the wiring electrodes from being stripped off from the circuit board.

Figure 8:
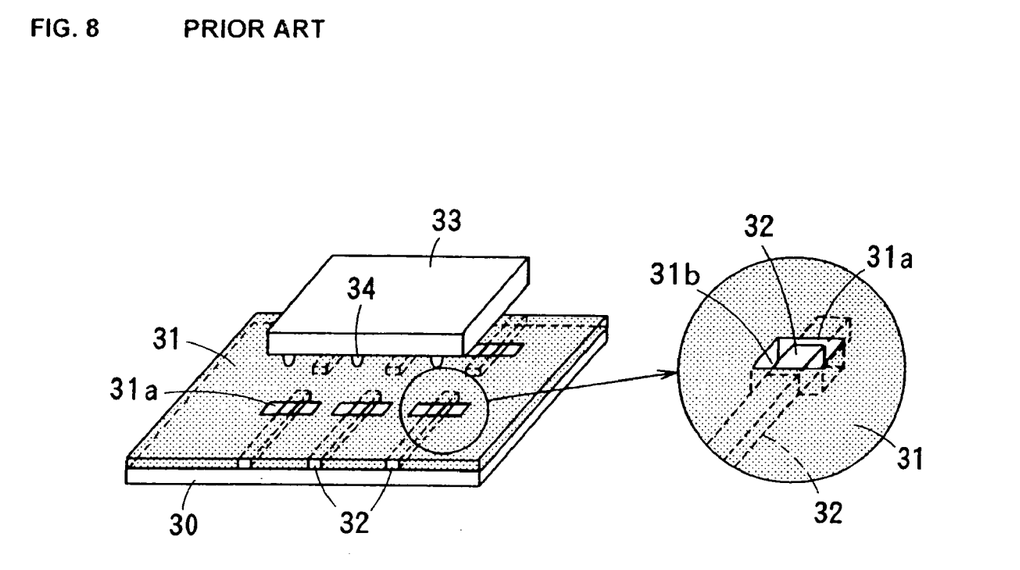
FIG. 8 is an exploded perspective view of an electronic device of the related art.
Figure 9:
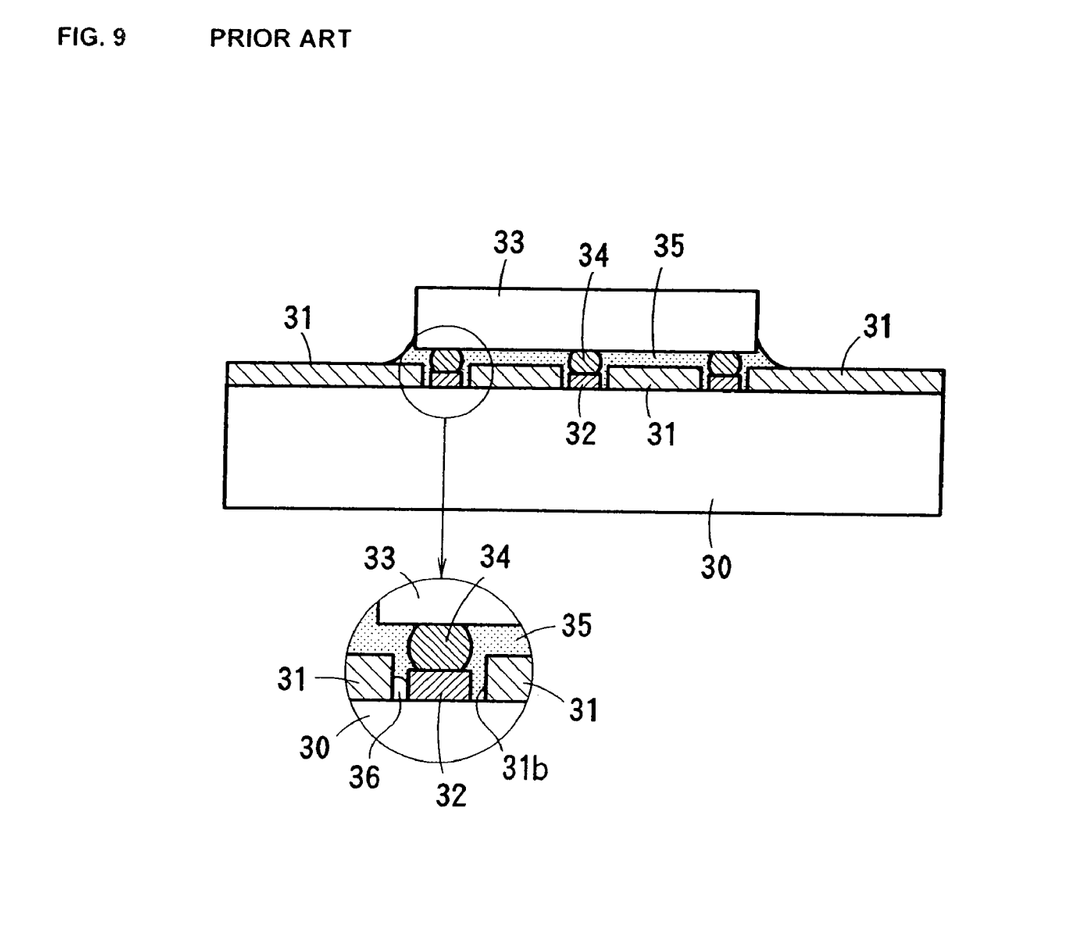
FIG. 9 is a cross-sectional view of the electronic device shown in FIG. 8.

FIGS. 8 and 9 show the structure of an electronic device of the related art.

An insulation film 31 is formed on substantially the entirety of a surface of a circuit board 30. The insulation film 31 has opening portions or uncoated portions 31$a$ in a one-to-one relation with wiring electrodes 32. Each of the opening portions 31$a$ is slightly wider than the corresponding wiring electrode 32 in order to improve the positional accuracy. Small recesses 31$b$ each having a depth equal to the thickness of the insulation film 31 are formed at both sides of each wiring electrode 32. The insulation film 31 is typically formed by printing solder resist, and the thickness of the insulation film 31 is about 30 $\mu$m to 50 $\mu$m.

An electronic component 33 is flip-chip mounted on the mounting board 30 by connecting bump electrodes 34 with portions of the wiring electrodes 32 exposed at the opening portions 31$a$. When sealing resin 35 is filled in a gap between the circuit board 30 and the electronic component 33, the sealing resin 35 flows through the gap and over the insulation film 31 by capillary action. However, the recesses 31$b$ have a small volume, thus causing air bubbles 36 to be trapped. The trapped air bubbles 36 cause voids to be generated in the hardened sealing resin 35, thus reducing its reliability.

As proposed in Japanese Unexamined Patent Application Publication No. 8-153752, one method to overcome such a problem is to insert the sealing resin and then defoam or de-air the sealing resin by applying a vacuum or by applying ultrasonic vibration.

However, such a de-airing process is not always effective to remove the trapped air, and voids may still be caused.

SUMMARY OF THE INVENTION

Accordingly, the present invention provides a mounting board in which recesses formed between an insulation film and wiring electrodes are reliably filled with sealing resin.

The present invention also provides an electronic device using this mounting board and having a void-free structure.

In an aspect of the present invention, a mounting board includes a base substrate having a first principal surface; a wiring electrode formed on the first principal surface of the base substrate; and an insulation film which partially covers the first principal surface of the base substrate and the wiring electrode. The insulation film has a coated portion where the base substrate and the wiring electrode are coated with the insulation film, and an opening portion where the base substrate and the wiring electrode are not coated with the insulation film. An electronic component may have a bump electrode formed so as to correspond to the wiring electrode in the opening portion, via which the electronic component may be mounted on the mounting board. The opening portion may straddle the wiring electrode and thereby form a recess on each side of the wiring electrode; or the opening portion may surround an end of the wiring electrode and thereby form a U-shaped recess at the end of the wiring electrode, for example. A gap between the first principal surface of the base substrate and the electronic component is filled with sealing resin. In this mounting board, L/T≧2 is satisfied, where L denotes the minimum width of a portion of the base substrate exposed at the opening portion and T denotes the thickness of the insulation film.

The ratio of the minimum width L of the portion of the base substrate exposed at the opening portion in the insulation film to the thickness T of the insulation film is greater than or equal to a predetermined value, thus ensuring that each recess formed between the opening portion and the wiring electrode is filled with the resin and ensuring a void-free structure.

More specifically, by satisfying L/T≧2, the width L of a recess formed in the opening portion is relatively increased so that the resin can easily flow therein to realize a void-free structure. Therefore, a high-reliability sealed construction can be realized. In addition, a simple sealing operation without any special de-airing operation is carried out, thus reducing the production cost.

The viscosity of the resin is one of the important factors for successful filling with the resin. The viscosity of the resin depends upon the temperature; however, a preferable viscosity range is from 0.02 Pa·s to 10 Pa·s, and more preferably from 0.4 Pa·s to 7.3 Pa·s.

In another aspect of the present invention, a mounting board includes a base substrate having a first principal surface; a wiring electrode formed on the first principal surface of the base substrate; and an insulation film which partially covers the first principal surface of the base substrate and the wiring electrode. The insulation film has a coated portion where the base substrate and the wiring electrode are coated with the insulation film, and an uncoated portion where the base substrate and the wiring electrode are not coated with the insulation film. An electronic component may have a bump electrode formed so as to correspond to the wiring electrode in the opening portion, via which the electronic component may be mounted on the mounting board. A gap between the first principal surface of the base substrate and the electronic component is filled with sealing resin. In the mounting board, the coated portion of the insulation film includes a first coated portion and a second coated portion which extend substantially in parallel to each other with a predetermined spacing therebetween and which are substantially orthogonal to the wiring electrode, and the uncoated portion between the first and second coated portions is open and extends substantially orthogonally to the wiring electrode.

In this case, the insulation film is formed on appropriate portions of the wiring electrode rather than on the entirety of the wiring electrode, and there is no small recess, in which air can be entrapped, between a side surface of the wiring electrode and an inner sidewall of each coated portion. Therefore, the resin easily flows therein to realize a void-free structure.

Since the uncoated portion between the first and second coated portions is open orthogonally to the wiring electrode, there occurs no air entrapment when filled with the resin. Therefore, a high-reliability void-free sealed construction can be realized.

In still another aspect of the present invention, a mounting board includes a base substrate having a first principal surface; at least one wiring electrode formed on the first principal surface of the base substrate; and an insulation film which partially covers the first principal surface of the base substrate and the wiring electrode. The insulation film has a coated portion where the base substrate and the wiring electrode are coated with the insulation film, and an opening portion where the base substrate and the wiring electrode are not coated with the insulation film. An electronic component may have a bump electrode formed so as to correspond to the wiring electrode in the opening portion, via which the electronic component may be mounted on the mounting board. A gap between the first principal surface of the base substrate and the electronic component is filled with sealing resin. In the mounting board, the wiring electrode is formed of a plurality of electrodes extending in parallel to each other, and the opening portion is substantially orthogonal to the wiring electrodes and extends over a plurality of the wiring electrodes.

That is, the opening portion is continuously formed between adjacent wiring electrodes to form a continuous channel, into which the resin easily flows. A void-free structure can therefore be realized.

In still another aspect of the present invention, an electronic device includes the above-described mounting board; the electronic component mounted on the mounting board by connecting the bump electrode with a portion of the wiring electrode exposed at the opening portion or the uncoated portion of the mounting board; and the sealing resin filled and hardened in a gap between the first principal surface of the base substrate and the electronic component.

An electronic device using the above-described mounting board realizes a void-free sealed structure having high reliability, while requiring no special defoaming or de-airing operation.

Other features and advantages of the present invention will become apparent from the following description of embodiments of the invention which refers to the accompanying drawings.

BRIEF DESCRIPTION OF THE DRAWINGS

FIGS. 3A and 3B are tables of experimental results of the occurrence of voids with changes of the length L1 of a recess and the thickness T of an insulation film, in which FIG. 3A shows the experimental result for resin viscosity of 0.4 Pa·s and FIG. 3B shows the experimental result for resin viscosity of 7.3 Pa·s;

DESCRIPTION OF EMBODIMENTS OF THE INVENTION

Figure 1:
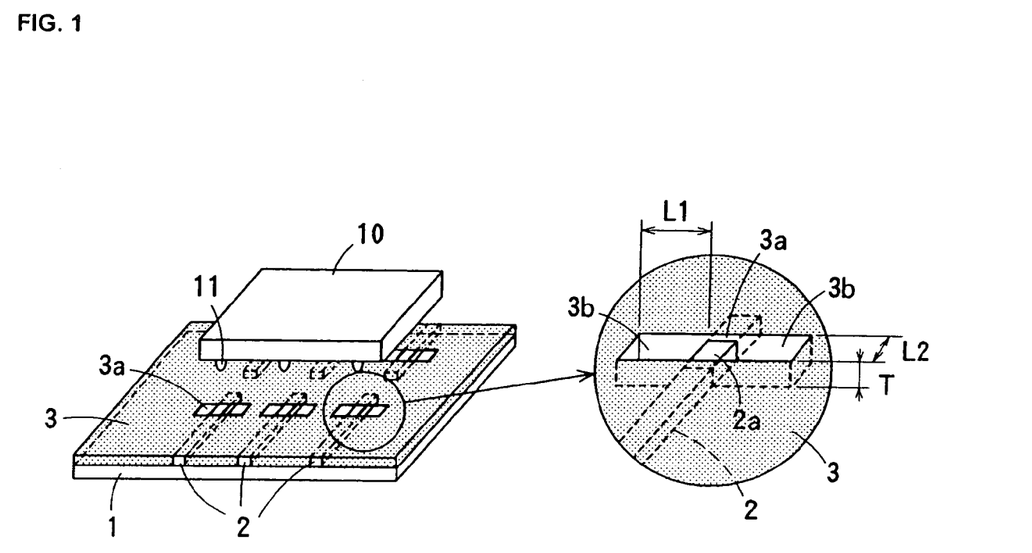
FIG. 1 is an exploded perspective view of an electronic device according to a first embodiment of the present invention.
Figure 2:
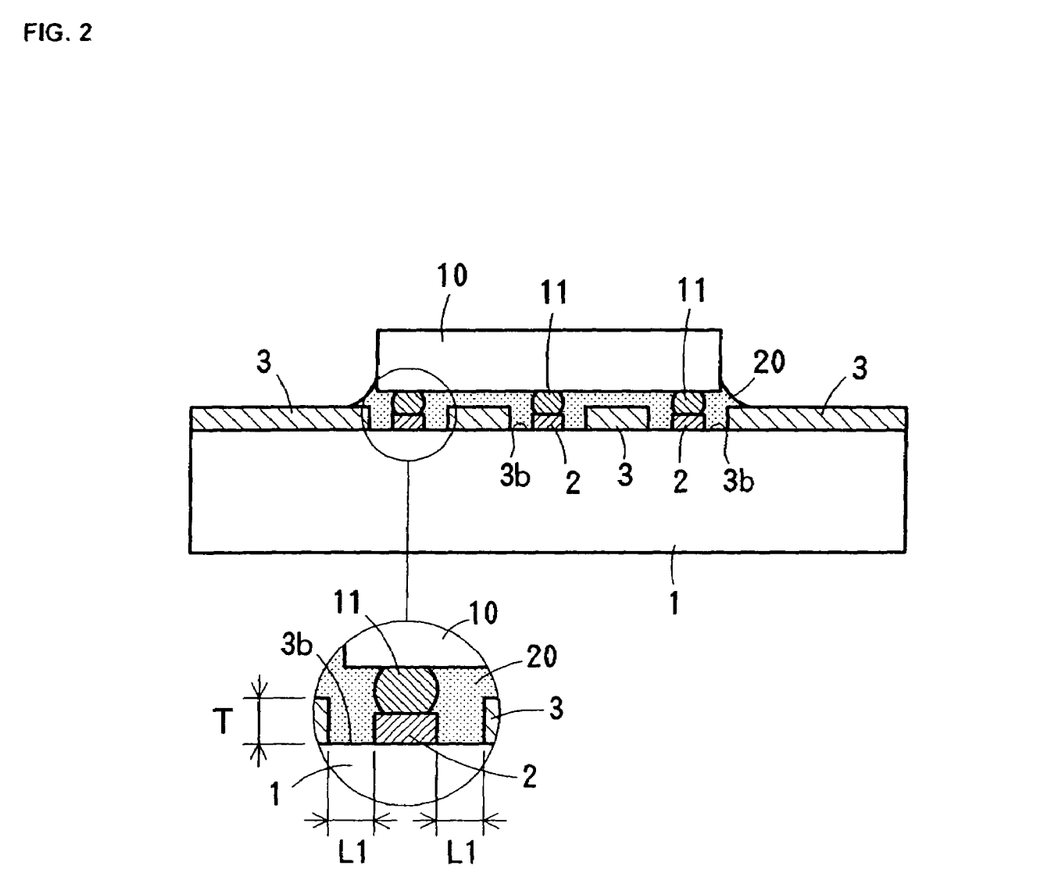
FIG. 2 is a cross-sectional view of the electronic device shown in FIG. 1.

FIGS. 1 and 2 show an electronic device according to a first embodiment of the present invention.

In this electronic device, an electronic component 10 is packaged by face-down mounting on a mounting board 1.

The mounting board 1 is formed of a ceramic board such as an alumina board, a dielectric board made of ceramics, a multilayer ceramic board, a glass board, a crystalline board, or an airtight board made of glass epoxy resin. A plurality of (in this example, six) wiring electrodes 2 extending in parallel to each other are formed on a surface of the mounting board 1. In the first embodiment, one set of three wiring electrodes 2 faces another set, the electrodes of each set being spaced a predetermined distance apart from each other. An insulation film 3, such as solder resist, having substantially a uniform thickness is further formed on approximately the entire surface of the mounting board 1 using a technique such as a screen printing process so as to overlie the wiring electrodes 2. The insulation film 3 has a predetermined number of (in this example, six) opening portions 3a. Portions 2a of the wiring electrodes 2 are exposed at the opening portions 3a.

As shown in FIG. 1, the opening portions 3a of the insulation film 3 are substantially orthogonal to the longitudinal direction of the wiring electrodes 2, and each opening portion 3a has recesses 3b at both sides of the corresponding wiring electrode 2. In this figure, the longitudinal length of each recess 3b (the distance between a side surface of each wiring electrode 2 and an inner sidewall of the corresponding opening portion 3a) is indicated by L1; the lateral distance between the opposing inner sidewalls of each opening portion 3a is indicated by L2, and the thickness of the insulation film 3 is indicated by T. In this embodiment of the invention, the following relationships are satisfied:

$L1/T \geq 2$ $L2/T \geq 2$

In other words, the ratio of the minimum width L of a portion of the mounting board 1 exposed at each opening portion 3a to the thickness of the insulation film 3 is greater than or equal to 2.

The electronic component 10 is formed of a semiconductor device such as an IC, a ceramic device, or the like, and has a plurality of (in this example, six) bump electrodes 11 fixedly formed on one principal surface thereof. The bump electrodes 11 may be formed of metal bumps mainly made of Au, Ag, Pd, or Cu, or solder bumps. In this embodiment, the bump electrodes 11 are formed of solder bumps. The bump electrodes 11 are bonded with the portions 2a of the wiring electrodes 2 exposed at the opening portions 3a by applying a combination of ultrasonic waves and pressure, a combination of heat and pressure, or a combination of ultrasonic waves, heat, and pressure to the exposed portions 2a. After the electronic component 10 is packaged by face-down mounting on the mounting board 1, sealing resin 20, such as epoxy resin, is injected by a dispenser into a gap between the mounting board 1 and the electronic component 10, and is then hardened. Examples of the sealing resin 20 include thermosetting resin and UV hardening resin. Preferably, the viscosity of the resin 20 is 0.02 to 10 Pa·s in order to ensure that the recesses 3b are filled with the resin 20.

Figure 3A:
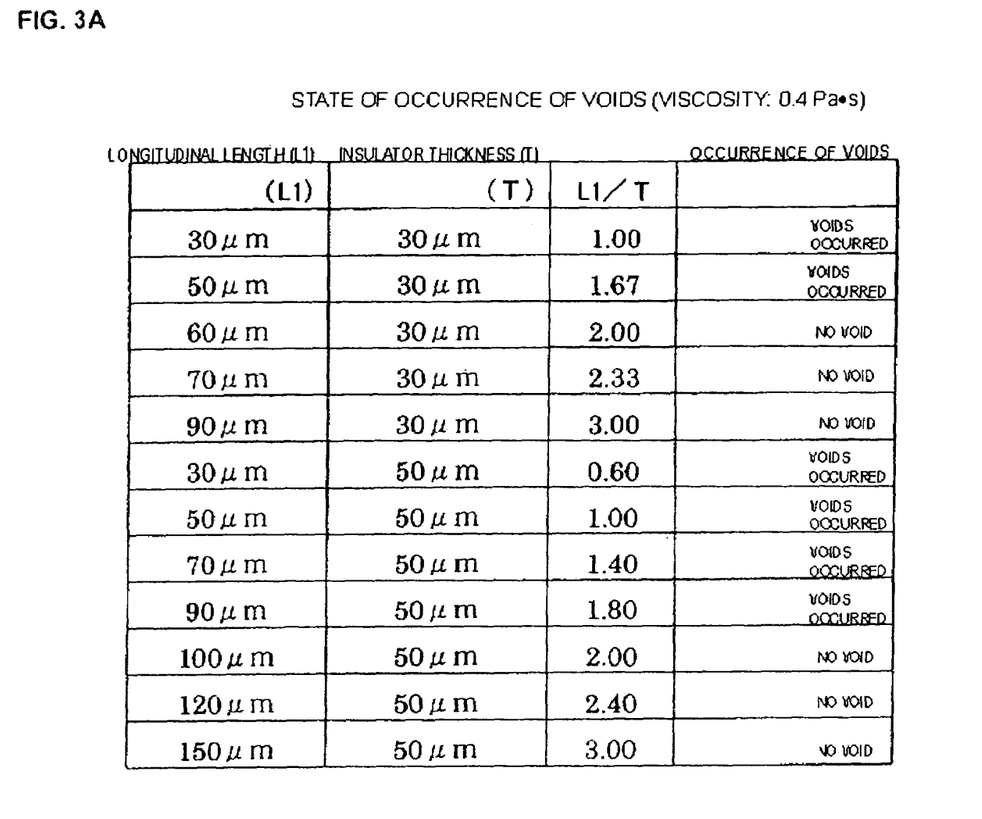
Figure 3B:
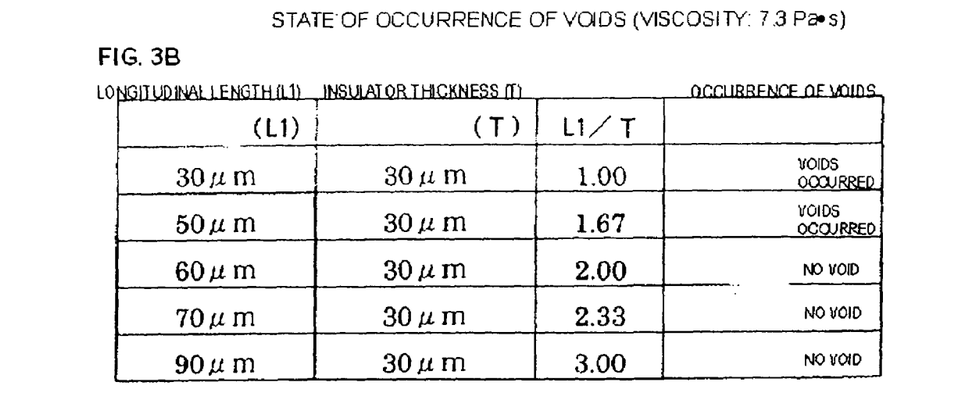

FIGS. 3A and 3B show experimental results of the occurrence of voids with changes of the length L1 of the recess 3b and the thickness T of the insulation film 3.

FIG. 3A shows the experimental result when the viscosity of the sealing resin 20 is 0.4 Pa·s, and FIG. 3B shows the experimental result when the viscosity of the sealing resin 20 is 7.3 Pa·s.

As seen from the tables shown in FIGS. 3A and 3B, voids were observed when the ratio of the length L1 of the recess 3b to the thickness T of the insulation film 3, i.e., L1/T, was lower than 2, whereas no void was observed when the L1/T ratio was greater than or equal to 2. Thus, when the L1/T ratio was greater than or equal to 2, the recesses 3b were successfully filled with the sealing resin 20 without air entrapped, regardless of the viscosity of the resin 20. Consequently, a high-reliability void-free electronic device was realized.

In this experiment, the width L2 of each opening portion 3a was 100 μm. When the L2/T ratio was greater than or equal to 2, similar results to those shown in FIGS. 3A and 3B were obtained.

Figure 4:
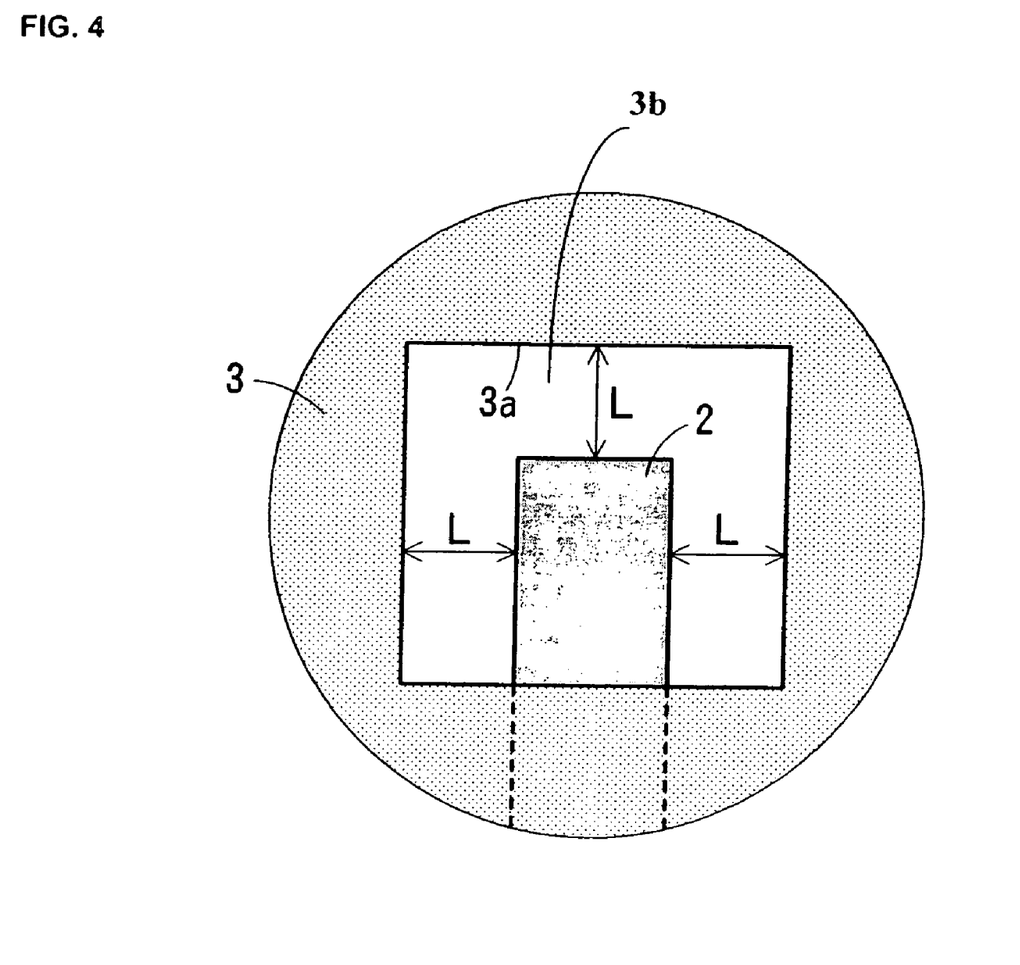
FIG. 4 is a plan view of a modification of the electronic device according to the first embodiment, showing another positional relationship between the wiring electrodes and the opening portions.

FIG. 4 shows a modified form of this embodiment, having a different positional relationship between each opening portion 3a in the insulation film 3 and the corresponding wiring electrode 2.

In the example shown in FIG. 1, each opening portion 3a in the insulation film 3 is substantially orthogonal to the longitudinal direction of the corresponding wiring electrode 2. In the example shown in FIG. 4, in contrast, each opening portion 3a is formed around one end of a wiring electrode 2 forming a U-shaped recess 3b. When $L/T \geq 2$ is satisfied, where L denotes the minimum width of a portion of the mounting board 1 exposed at the opening portion 3a, that is, the distance between a side surface of the wiring electrode 2 and an inner sidewall of the opening portion 3a, and T denotes the thickness of the insulation film 3, the recess 3b can be successfully filled with the sealing resin 20 to realize a void-free structure.

Figure 5:
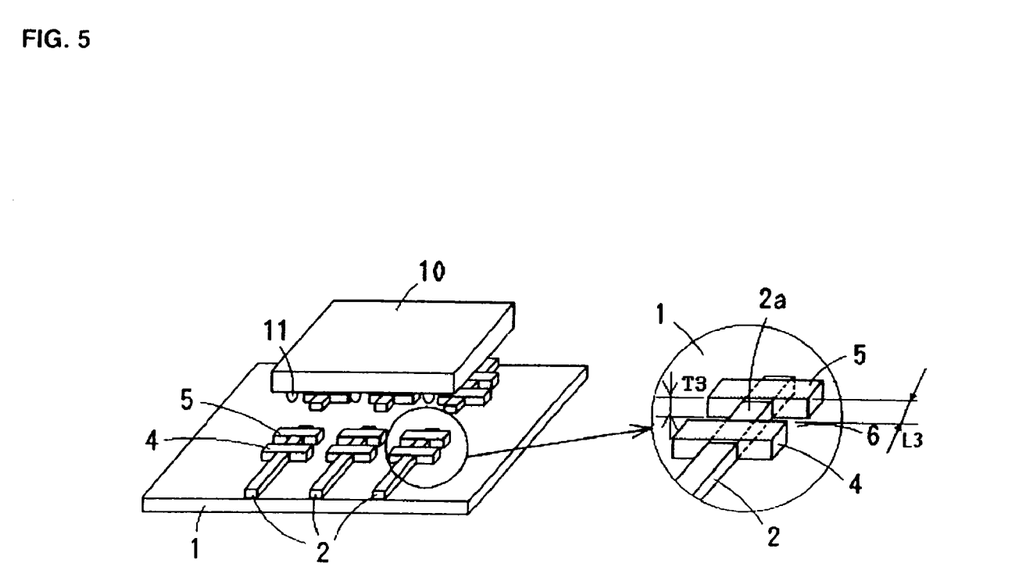
FIG. 5 is an exploded perspective view of an electronic device according to a second embodiment of the present invention.

FIG. 5 shows an electronic device according to a second embodiment of the present invention. The same reference numerals are given to the same portions as those in the first embodiment, and a duplicate description thereof is omitted. Here, in this mounting board, $L3/T3 \geq 2$ is satisfied, where T3 denotes the minimum thickness of first and second coated portions 4 and 5 and L3 denotes a clearance of an uncoated portion 6.

In the second embodiment, the insulation film 3 described in the first embodiment is replaced with an insulation film formed of the first and second coated portions 4 and 5 which extend in parallel to each other with a predetermined spacing therebetween and which are substantially orthogonal to the wiring electrodes 2. The uncoated portion 6 between the first and second coated portions 4 and 5 is open substantially orthogonally to the corresponding wiring electrode 2.

Unlike the first embodiment, this embodiment does not have a pair of recesses formed on the two sides of each wiring electrode 2. The uncoated portion 6 between the first and second coated portions 4 and 5 allows a gap between the mounting board 1 and the electronic component 10 to be filled with the sealing resin 20 without any air being entrapped. A void-free sealed construction can therefore be realized.

Figure 6:
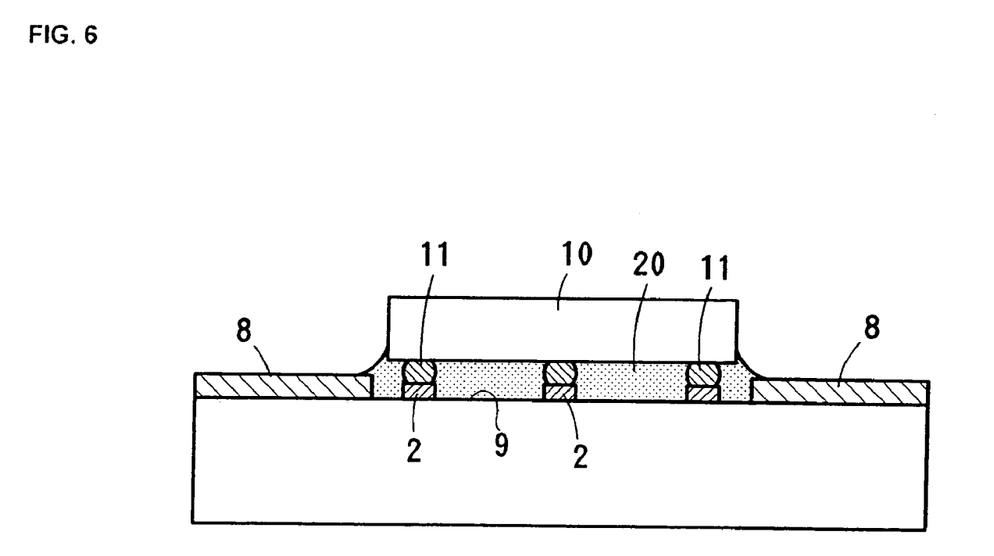
FIG. 6 is a cross-sectional view of an electronic device according to a third embodiment of the present invention.
Figure 7:
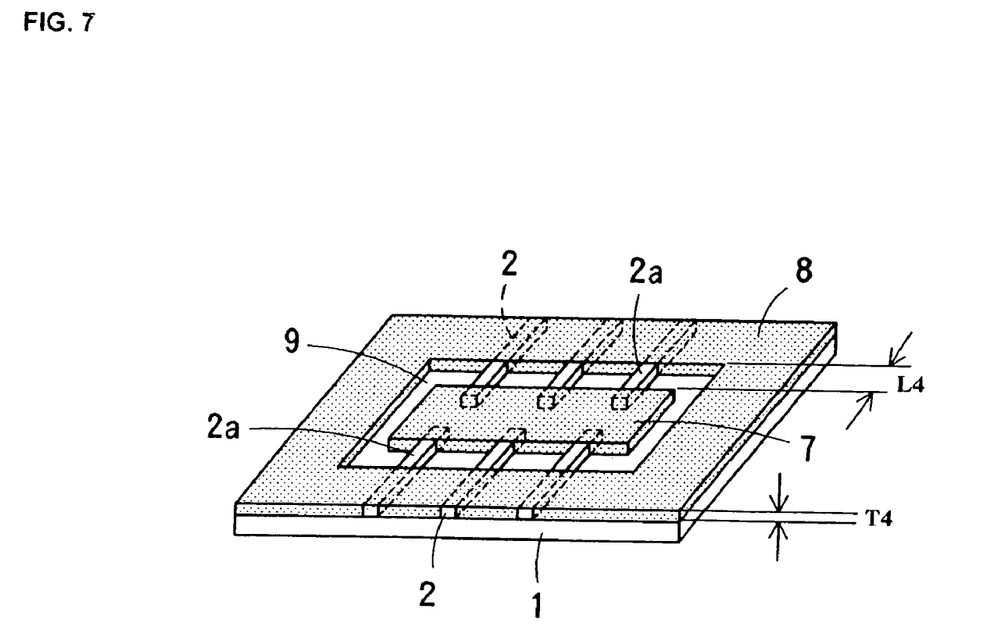
FIG. 7 is a perspective view of a mounting board of the electronic device shown in FIG. 6.

FIGS. 6 and 7 show an electronic device according to a third embodiment of the present invention. The same reference numerals are given to the same portions as those in the first embodiment, and a duplicate description thereof is omitted. Here, in this mounting board, $L4/T4 \geq 2$ is satisfied, where T4 denotes the minimum thickness of a coated portion 8 and L4 denotes a clearance of an frame-shaped uncoated portion 9.

In the third embodiment, the insulation film 3 described in the first embodiment is replaced with an insulation film formed of a first coated portion 7 which is coated upon an inside portion of the mounting board 1 including the inner ends of the wiring electrodes 2, and the second coated portion 8 which is coated upon the outer peripheral portion of the mounting board 1 including the outer ends of the wiring electrodes 2. The frame-shaped uncoated portion (opening portion) 9 is formed between the first and second coated portions 7 and 8. In other words, the uncoated portion 9 is substantially orthogonal to the wiring electrodes 2, and extends over the wiring electrodes 2.

As in the second embodiment, this embodiment does not have a recess formed at each side of each wiring electrode 2. The opening portion 9 forms a continuous channel substantially orthogonal to the wiring electrodes 2, and the sealing resin 20 filled in a gap between the mounting board 1 and the electronic component 10 easily flows in the opening portion 9. The opening portion 9 can be successfully filled with the sealing resin 20, thus realizing a void-free sealed construction.

The present invention is not limited to the above-described embodiments.

The opening portion 9 is formed in the shape of a frame in the third embodiment; however, this is merely an example. The opening portion 9 may be formed as two continuous opening portions, one being transverse to the first set of the wiring electrodes 2, and the other continuous opening portion being transverse to the remaining wiring electrodes 2.

In the above-described embodiments, the bump electrodes 11 formed on the electronic component element 10 are bonded with the wiring electrodes 2 on the mounting board 1. The present invention is not limited thereto The bump electrodes 11 may be formed instead on the wiring electrodes 2, and the bump electrodes 11 may be bonded with electrodes on the electronic component element 10.

The electronic component 10 of the present invention is not limited to a semiconductor device, and may be a piezoelectric component including a SAW (surface acoustic wave) device.

Also, the locations of the uncoated portions (opening portion) where a mounting board and wiring electrodes are not coated with an insulation film, are not limited to the locations shown herein. The uncoated portions may be formed midway along the wiring electrodes, or may be formed around the trailing ends of connection electrodes, for example.

Although the present invention has been described in relation to particular embodiments thereof, many other variations and modifications and other uses will become apparent to those skilled in the art. Therefore, the present invention is not limited by the specific disclosure herein.

What is claimed is:

1. A mounting board comprising:
   a base substrate having a first principal surface;
   a wiring electrode formed on the first principal surface of the base substrate; and
   an insulation film which partially covers the first principal surface of the base substrate and the wiring electrode, the insulation film having a coated portion where the base substrate and the wiring electrode are coated with the insulation film, and an uncoated portion where the base substrate and the wiring electrode are not coated with the insulation film,
   wherein the coated portion of the insulation film includes a first coated portion and a second coated portion which extend substantially in parallel to each other with a predetermined spacing therebetween and which are substantially orthogonal to the wiring electrode, and
   the uncoated portion between the first and second coated portions is open substantially orthogonally to the wiring electrode;
   wherein $L/T \geq 2$ is satisfied, where L denotes the width of a portion of the base substrate exposed at the uncoated portion and T denotes the thickness of the insulation film.

2. An electronic device comprising:
   the mounting board according to claim 1;
   an electronic component having a bump electrode formed so as to correspond to the wiring electrode in the uncoated portion, via which the electronic component is mounted on the mounting board, and a gap between the first principal surface of the base substrate and the electronic component being filled with sealing resin,
   the electronic component mounted on the mounting board by connecting the bump electrode with a portion of the wiring electrode exposed at the uncoated portion of the mounting board; and
   the sealing resin filled and hardened in a gap between the first principal surface of the base substrate and the electronic component.

3. The electronic device of claim 2, wherein said sealing resin has a viscosity range of 0.02 to 10 Pa·s before hardening.

4. The electronic device of claim 3, wherein said viscosity range is 0.4 to 7.3 Pa·s.

5. A mounting board comprising:
   a base substrate having a first principal surface;
   at least one wiring electrode formed on the first principal surface of the base substrate; and
   an insulation film which partially covers the first principal surface of the base substrate and the wiring electrode, the insulation film having a coated portion where the base substrate and the wiring electrode are coated with the insulation film, and an opening portion where the base substrate and the wiring electrode are not coated with the insulation film,
   wherein the wiring electrode comprises a plurality of electrodes extending in parallel to each other, and
   the opening portion is substantially orthogonal to the wiring electrodes, and extends over a plurality of the wiring electrodes;
   wherein $L/T \geq 2$ is satisfied, where L denotes the width of a portion of the base substrate exposed at the opening portion and T denotes the thickness of the insulation film.

6. An electronic device comprising:
   the mounting board according to claim 5;
   an electronic component having a bump electrode formed so as to correspond to the wiring electrode in the opening portion, via which the electronic component is mounted on the mounting board, and a gap between the first principal surface of the base substrate and the electronic component being filled with sealing resin,
   the electronic component mounted on the mounting board by connecting the bump electrode with a portion of the wiring electrode exposed at the opening portion or the uncoated portion of the mounting board; and
   the sealing resin filled and hardened in a gap between the first principal surface of the base substrate and the electronic component.

7. The electronic device of claim 6, wherein said sealing resin has a viscosity range of 0.02 to 10 Pa·s before hardening.

8. The electronic device of claim 7, wherein said viscosity range is 0.4 to 7.3 Pa·s.

* * * * *